United States Patent [19]

Hsu et al.

[11] Patent Number: 5,214,608

[45] Date of Patent: May 25, 1993

[54] DUAL SENSE AMPLIFIER STRUCTURE FOR VIDEO RAMDACS

[75] Inventors: Wei-Chan Hsu, Cupertino; Wei-Kuang J. Chiu, San Jose, both of Calif.

[73] Assignee: Windbond Electronics, N.A. Corporation, Santa Clara, Calif.

[21] Appl. No.: 691,711

[22] Filed: May 1, 1991

[51] Int. Cl.⁵ .................................. G11C 13/00
[52] U.S. Cl. ............................ 365/230.02; 365/230.03; 365/230.05; 365/230.08; 365/189.05; 365/201
[58] Field of Search ................. 365/230.02, 230.03, 365/230.05, 230.08, 189.05, 201

[56] References Cited

U.S. PATENT DOCUMENTS

| | | | |
|---|---|---|---|
| 4,868,548 | 9/1989 | Gelvin | 340/709 |
| 4,905,189 | 2/1990 | Brunolli | 364/900 |
| 4,954,987 | 9/1990 | Auvinen et al. | 365/230.02 |
| 4,990,915 | 2/1991 | Kondoh et al. | 341/144 |
| 5,001,671 | 3/1991 | Koo et al. | 365/230.02 |

Primary Examiner—John S. Heyman
Assistant Examiner—Scott A. Ouellette
Attorney, Agent, or Firm—Skjerven, Morrill, MacPherson, Frankling & Friel

[57] ABSTRACT

A dual sense amplifier structure and a method are provided in a RAMDAC, to allow the video path to be probed digitally during testing. Each of the two sets of sense amplifiers in the dual sense amplifier structure can be individually enabled to provide the same output data to both a color value register accessible over a data port and the digital-to-analog converters for interface with an analog display. In one embodiment, the sense amplifiers which provide color values to a data port interfaced with the CPU are implemented by simpler circuits than the sense amplifiers which used to provide the color values to the DACs.

6 Claims, 7 Drawing Sheets

DUAL SENSE AMPLIFIER STRUCTURE FOR VIDEO RAMDACS

CROSS REFERENCE TO RELATED APPLICATIONS

Copending application Ser. No. 07/691,712, entitled "DAC Current Source with Stabilizing Bias," by C. Nguyen et al., filed on the same day as the present U.S. application, also assigned to the Assignee of the present application, is hereby incorporated by reference in its entirety.

Copending application Ser. No. 07/691,710, entitled "Switchable Current-Reference Voltage Generator," by W. Hsu et al., filed on the same day as the present application, now U.S. Pat. No. 5,142,219, also assigned to the Assignee of the present application, is hereby incorporated by reference in its entirety.

FIELD OF THE INVENTION

This invention relates to the design of integrated circuits, and in particular, relates to the design of integrated circuits of the type known as random access memory with digital-to-analog converters (RAM-DACs).

BACKGROUND OF THE INVENTION

Under the high performance VGA standard, 24 bits (8 bits each for the red, green and blue color components) are used to specify a color. Because the number of pixels in a full screen is enormous, in many high-resolution graphics applications, neither providing a 24-bit wide data bus between the central processing unit (CPU) and the graphics display unit, nor providing a narrower but higher bandwidth bus, is economical. Instead, because the number of colors actually used at any given time is relatively small, as compared to the number of possible colors, a color palette containing a fixed but small number of color values is often used to reduce the bandwidth requirement. One popular color palette contains a 24-bit wide random access memory (RAM) storing 256 color values. To specify any one of the 256 color values, rather than the 24-bit color value, the CPU provides the address of a 24-bit word in the RAM; in this instance, the 256 addresses in the palette can be specified by eight bits. The 256 color values in the RAM is initialized at the beginning of the graphics operation, and can be dynamically updated by substituting new color values thereafter. As a result, since each color value is specified by its 8-bit address in the palette, the bandwidth requirement for such a system is much reduced from that required to specify the color value directly. Such system also reduces the size of the video frame buffer by two-thirds, since the 8-bit palette RAM addresses—rather than 24-bit color values —are stored in the video frame buffer.

A schematic representation of a color palette circuit 100 in the prior art is shown in FIG. 1. As shown in FIG. 1, the color palette circuit 100 consists of a 8-bit data port 107 sending and receiving both addresses and data during the reading or writing of color values in and out of the RAM 105. Because data port 107 is 8-bit wide, reading and writing a 24-bit color value requires multiple clock periods. Therefore, address register 101, and three 8-bit color registers 102a, 102b and 102c are provided internally for temporary storage during reading and writing of the RAM 105. During graphics operations, however, the addresses are received at every clock period over address lines P0-P7 at the 8-bit pixel address port 108, and a color value is provided in analog form at the output lines 110 every clock period.

In color palette circuit 100, RAM 105 can be configured as a 256×24-bit color palette 105, for storing 256 24-bit color values, or as a 256×18-bit color palette 105a, for storing 256 18-bit color values, with an additional 15×18-bit overlay palette 105b to implement additional functions known in the art, such as overlay cursors, or grids. In the latter mode, the address received at address port 108, which is stored in pixel register 103, is processed with the content of the pixel mask register 104 to provide an address for a color value in either the main color palette 105a, or the overlay palette 105b. Multiplexer 112 provides on address lines 113 either the pixel address on the address lines 114 and 115 or the address provided by address register 101 on lines 116, depending on whether output of a color value at the analog output lines 110, or an access such as loading a new color value, by the microprocessor is desired. Decoders (not shown) of RAM 105 decodes the address on lines 113 and provides read or write access to the RAM location specified on lines 113. For read operation, the output data of RAM 105 are tapped from lines 117. The write data lines into RAM 105 are not shown.

A color value read from RAM 105 is divided into its three color components before providing each to one of three digital-to-analog converters (DACs) 106a, 106b and 106c. Together, DACs 106a, 106b and 106c provide the analog signals suitable for driving an RGB type monitor. One color value is provided every clock cycle on the analog lines 110. Operation control for the color palette 100 is provided by control unit 109. Because color palette circuits, such as color palette circuit 100, comprise both RAM and DACs, they are also known as random access memory with digital-to-analog converters (RAMDACs).

In implementing the color palette circuit 100, a portion of the circuit is typically laid out in the manner shown in FIG. 2. RAM 105, sense amplifiers 111, DACs 106a, 106b and 106c, the color value register (CVR) 102, which is the combination of the individual color value registers 102a, 102b and 102c discussed above, and the analog lines 110 are shown. As can be seen from FIG. 2, because of the need to minimize the routing distance between the sense amplifiers 111 and the DACs 106a, 106b and 106c, the DAC structures are laid out very close to the sense amplifiers 111. Hence, the output values of the sense amplifiers 111 to the CVR 102 must also be tapped in the vicinity of the DACs structure, resulting in the need to route a 24-bit bus over a relatively long distance (area 120). Routing of such a wide bus is expensive in silicon area.

Furthermore, because the same sense amplifiers 111 are used to provide color values to both CVR 102 and the DACs 106a, 106b and 106c, the output data from the sense amplifiers 111 are often designed to multiplex between CVR 102 and DACs 106a, 106b and 106c, so that the color value read or written using an address supplied over port 107 is not provided to DACs 106a, 106b and 106c in the "video path" (i.e. the path from pixel address port 103 to analog color value output port 110). As a result, the color value provided by the RAM 105 to DACs 106a, 106b and 106c in the video path are also not available to CVR 102. As a result, it is not possible to probe from port 107 the digital color value supplied to DACs 106a, 106b, and 106c. Such probing capability is important for testing purposes. Hence, for a color value accessed by specifying a pixel address on port 108, only the analog output signals on lines 110 can be examined during test.

A 1-bit sense amplifier circuit 300, which is suitable for use with each bit of the 24-bit RAM 105 in the RAMDAC circuit 100, is shown in FIG. 3. As shown in FIG. 3, an enable signal EN enables the circuit 300 by turning on transistor 301, thereby providing a current path to the ground supply voltage through either transistors 302 and 305, or transistors 303 and 306. The value of the bit is specified by the input voltages on line COL, and its complementary signal NCOL. To provide performance, transistors 304 and 307 are used to drive the circuit 300 to the resolved state rapidly. In circuit 300, the "trip-point" of inverter 311 is set to be 2.5 volts, and the voltages on the lines COL and NCOL are constrained by transistors 308, 309 and 310 to be between 2.0 and 3.0 volts, so that state resolution is achieved by a relative small voltage swing of 1.0 volt. The output of the sense amplifier circuit 300 is provided by inverter 312, at the terminal OUT. Fourteen transistors in total are required for each bit of RAM 105's output data.

Another alternative in the prior art is to provide the RAM as a dual-port memory, such as discussed in the U.S. Pat. No. 4,905,189, entitled "System for Reading and Writing information," by M. Brunolli, filed Dec. 18, 1985 and issued Feb. 27, 1990. Dual-port memory requires almost double the amount of decoding necessary for a single-port memory. Such organization is too expensive in terms of silicon area, especially in view that access by the CPU is relatively infrequent in most applications. In addition, even a dual-port memory does not allow probing the color value output to the DAC structure 106 by the CPU at the same time it is provided to DAC 106.

SUMMARY OF THE INVENTION

In accordance with the present invention, a dual sense amplifier structure and a method are provided in a RAMDAC, to allow a digital color value in the video path to be probed. One set of sense amplifiers is provided for sending the digital color value from the memory in the RAMDAC to the digital-to-analog converters. A second set of sense amplifiers is provided for sending the same digital color value to a data port for digital output. In one embodiment, the second set of sense amplifiers, which is used to provide color values to the data port are interfaced with a microprocessor. This second set of sense amplifiers are implemented by simpler circuits than the sense amplifiers used to provide the color values to the DACs. In that embodiment, as compared to the silicon area necessary to implement the single-amplifier structure of the prior art, the total silicon area is actually reduced, since much area devoted in the prior art to routing a wide bus to the data port is obviated.

The present invention is better understood upon consideration of the detailed description below and the accompanying drawings.

DETAILED DESCRIPTION OF THE PREFERRED EMBODIMENTS

Figure 4:
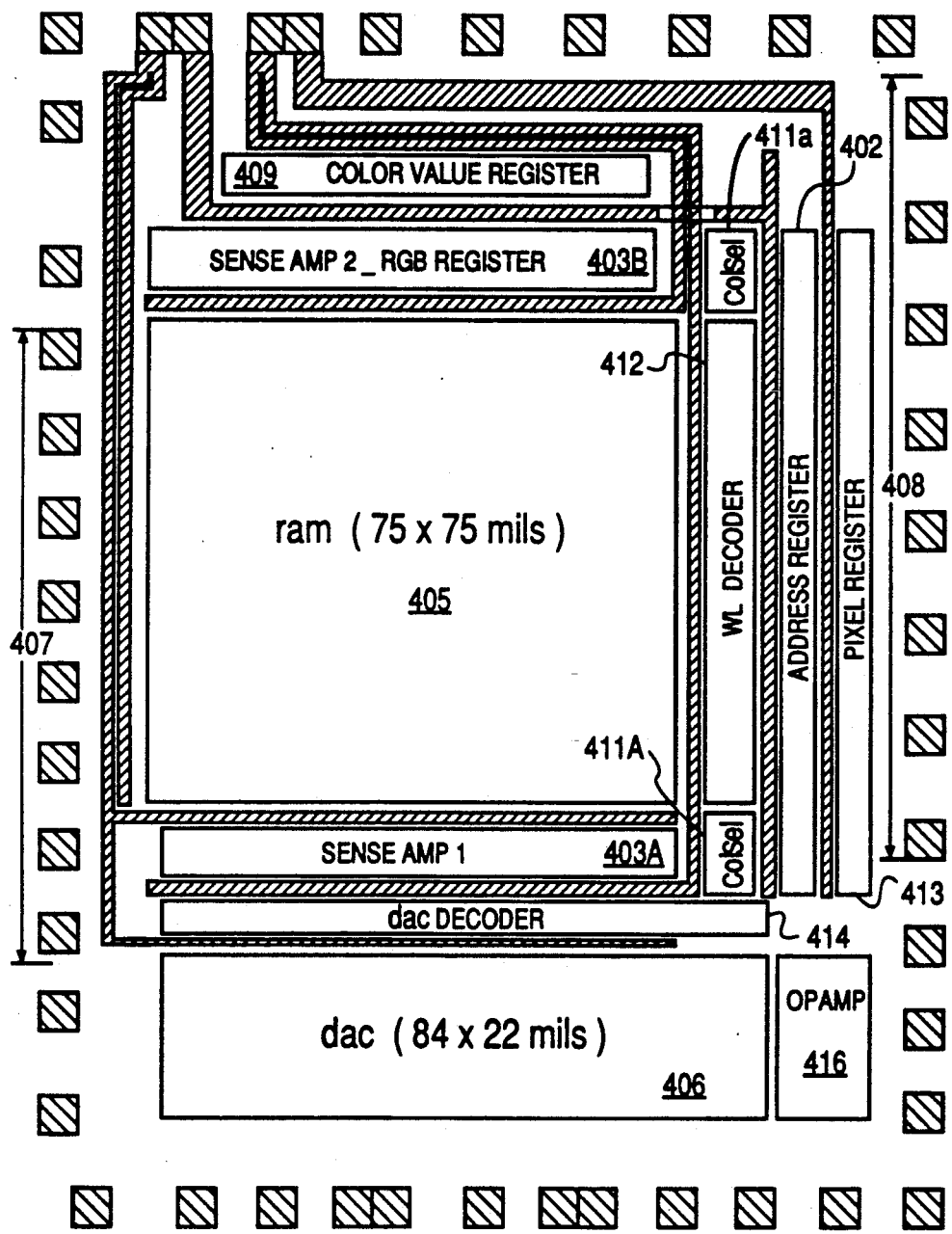
FIG. 4 is the layout scheme of a RAMDAC circuit 400, having dual sense amplifiers, provided in accordance with the present invention.

FIG. 4 shows a layout scheme of a RAMDAC circuit 400, having a dual sense amplifier structure 403 in accordance with the present invention. In FIG. 4, the dual sense amplifier structure comprises sense amplifiers 403a and sense amplifiers 403b. Sense amplifiers 403a provide output signals to DAC structure 406 after being decoded by DAC decoder 414. The analog output signals of DAC structure 406 are provided on analog bus 415. Sense amplifiers 403b provide output signals to the color value register in color value register structure 409, which also include functional decode logic 409. OP AMP structure 416 provides voltage reference signals to the DAC structure 406. The positions in the layout of other structures, e.g. control logic or address masking, are in accordance with any suitable design, including many conventional design.

Figure 1:
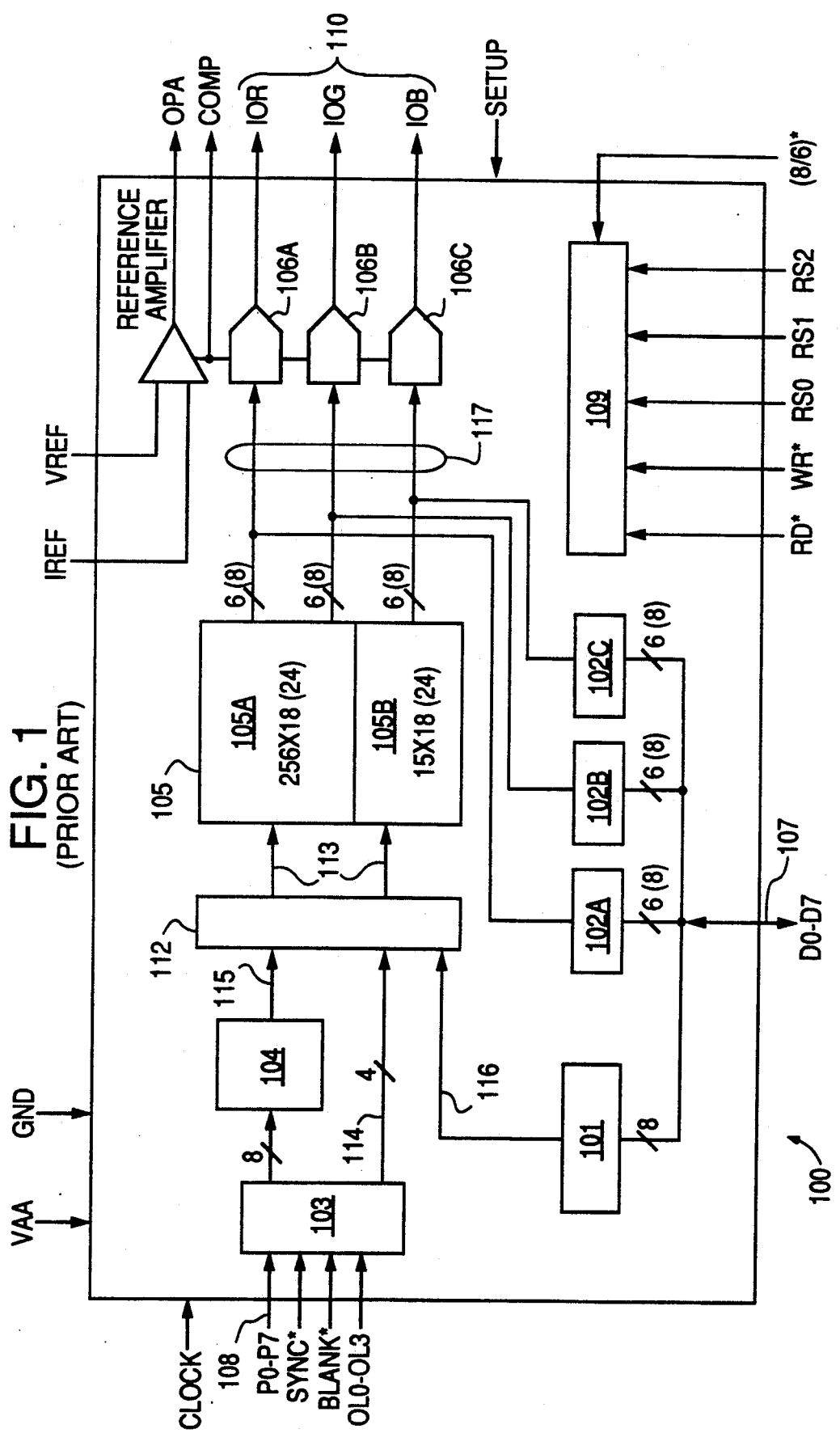
FIG. 1 is a schematic diagram of a RAMDAC circuit 100.
Figure 2:
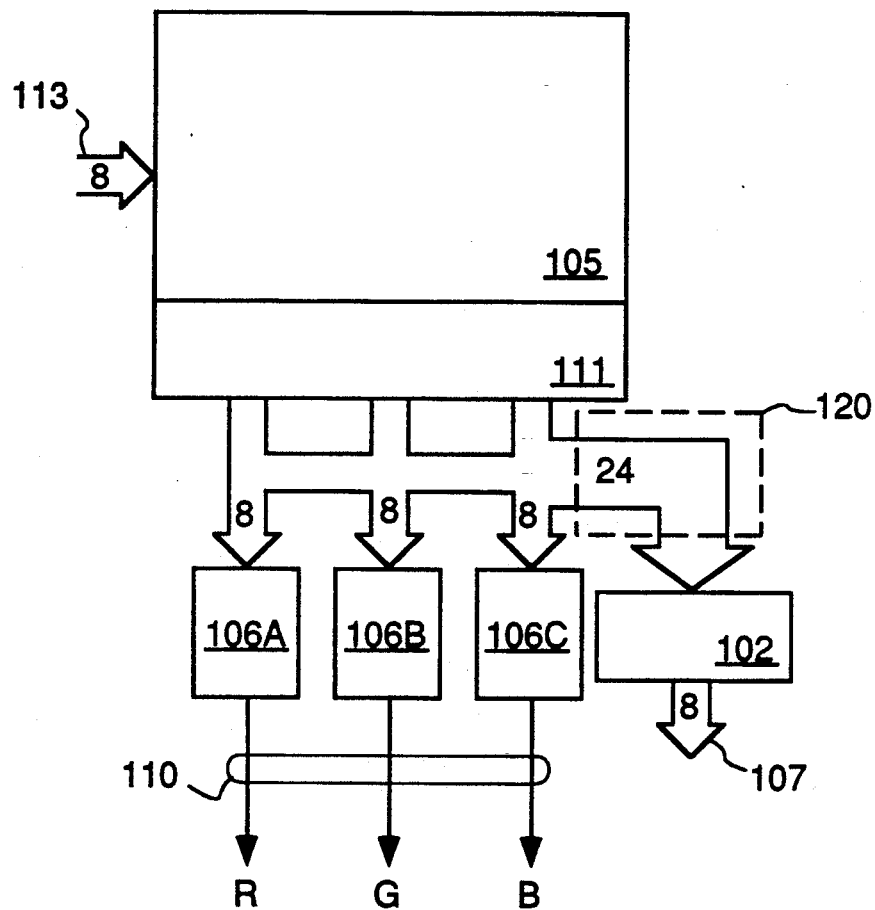
FIG. 2 is the layout scheme of a RAMDAC in the prior art, showing the RAM 105, CVR 102, and DACs 106a, 106b and 106c.

As shown in FIG. 4, the sense amplifiers 403a and 403b are located on opposite sides of a RAM structure 405. Of course, other placements of the sense amplifiers 403a and 403b are also possible. For example, the sense amplifiers 403a and 403b can also be placed on adjacent sides of the RAM structure 405. The output data of sense amplifiers 403a are provided to DAC structure 406, which includes DACs 406a, 406b and 406c. Unlike the prior art layout shown in FIG. 2, the sense amplifiers 403a providing 24-bit output data to the DACs are not multiplexed to provide data to the color value register structure (CVR 409). Instead, CVR 409 receives 24-bit data from the sense amplifiers 403b, and provides 8-bit multiplexed output data to the CPU via 8-bit port 407.

Figure 6:
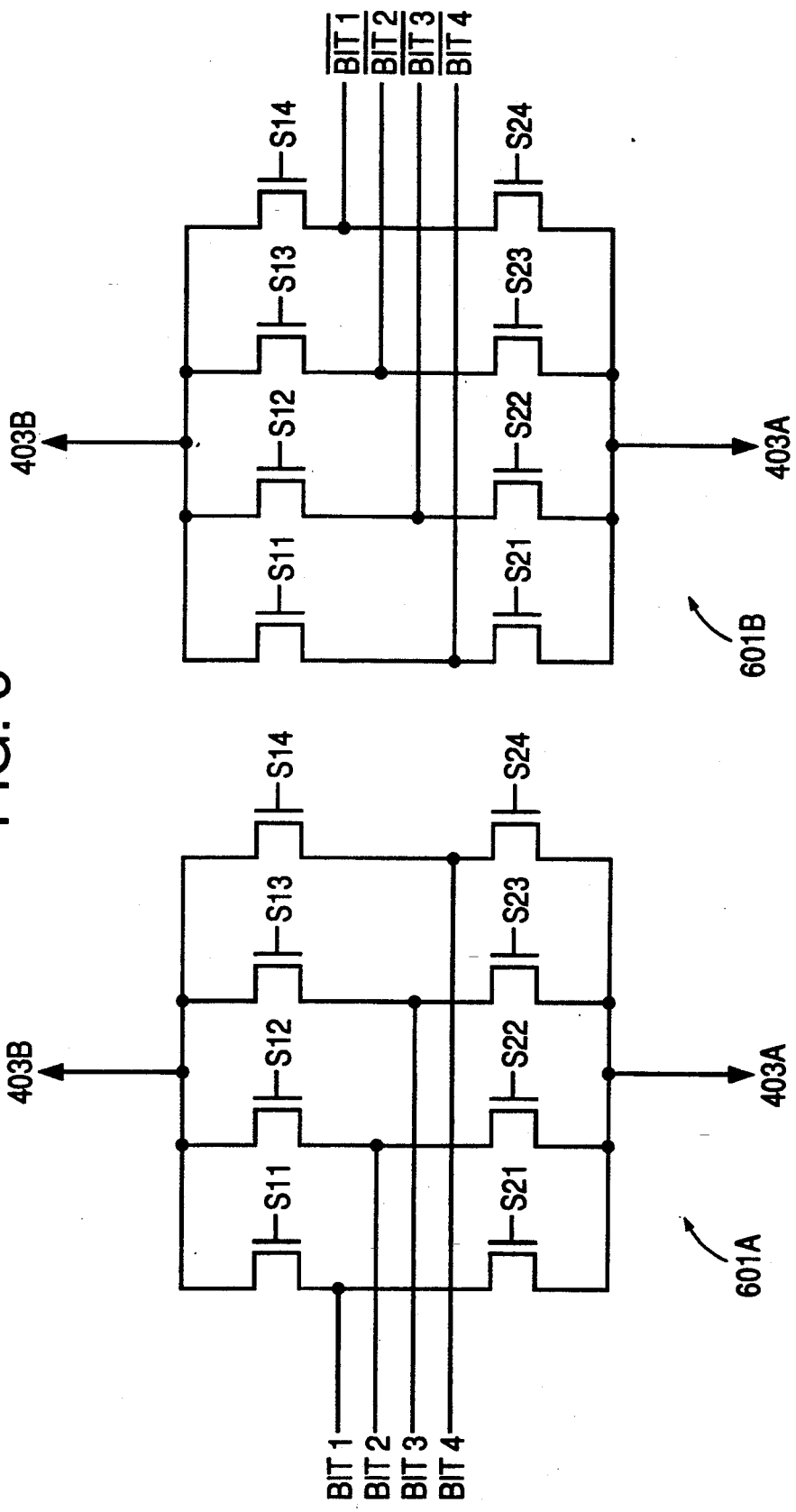
FIG. 6 shows bit-line select structures 601a and 601b each having transistor switches $S_{11}$-$S_{14}$ and transistor switches $S_{21}$-$S_{24}$ for providing, respectively, the stored value and its complement in a selected one of four memory cells to the first and second sense amplifier structures of circuit 400.

Pixel addresses are received from the frame buffer over 8-bit port 408 (P0-P7) into pixel register 413. The addresses from the CPU's read and write accesses are each provided over port 407 (D0-D7) and latched into address register 402. Multiplexers in the word-line decoder 412 selects either address register 402 or the pixel registers 413 for decoding the row address portion (6 bits wide) of the selected address. The column address portion (2 bits wide) of the address are decoded by two column select structures 411a and 411b. FIG. 6 illustrates the bit line selection by the column select structures 411a and 411b.

FIG. 6 shows bit-line select structures 601a and 601b receiving four sets of bit-lines (each set of bit-line carries complementary signals $\overline{\text{Bitn}}$ and Bitn, where n=1, 2, 3 or 4) each corresponding to a bit at one of four locations in RAM 405. One of the four bit-lines is selected to provide a 1-bit output value COL and its complement NCOL to both sets of sense amplifiers 403a and 403b. The selection of the bit value is accomplished by structure 411b turning one of the transistor switches $S_{11}$-$S_{14}$ in each of the structures 601a and 601b to provide the output bit to sense amplifiers 403b, and by structure 411a turning on one of the transistors $S_{21}$-$S_{24}$ in each of the bit-line select structures 601a and 601b to provide the 1-bit output to sense amplifiers 403a.

Figure 7:
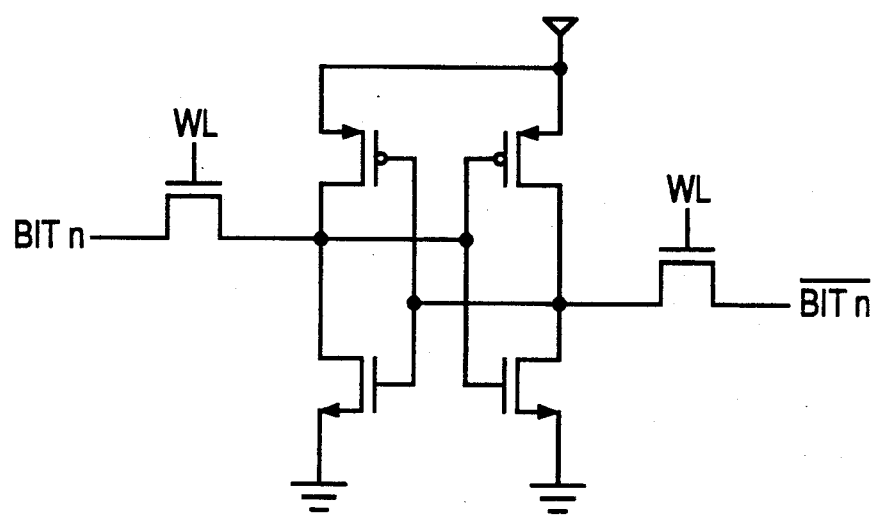
FIG. 7 shows a memory cell with a bit-line outputting a signal Bitn and its complement $\overline{\text{Bitn}}$.

FIG. 7 shows a memory cell suitable for providing the bit value in each of the four sets of bit-lines BIT-1-BIT4 shown in FIG. 6. Because RAM 405 is not organized as a dual port RAM, both the 1-bit output and its complement are supplied to both sets of sense amplifiers 403a and 403b. As a result, there is no need to provide an extra set of bit-lines, as is necessary in a dual-port RAM structure. As a result, the RAM structure in accordance with the present invention is more compact relative to a dual-port implementation.

Figure 3:
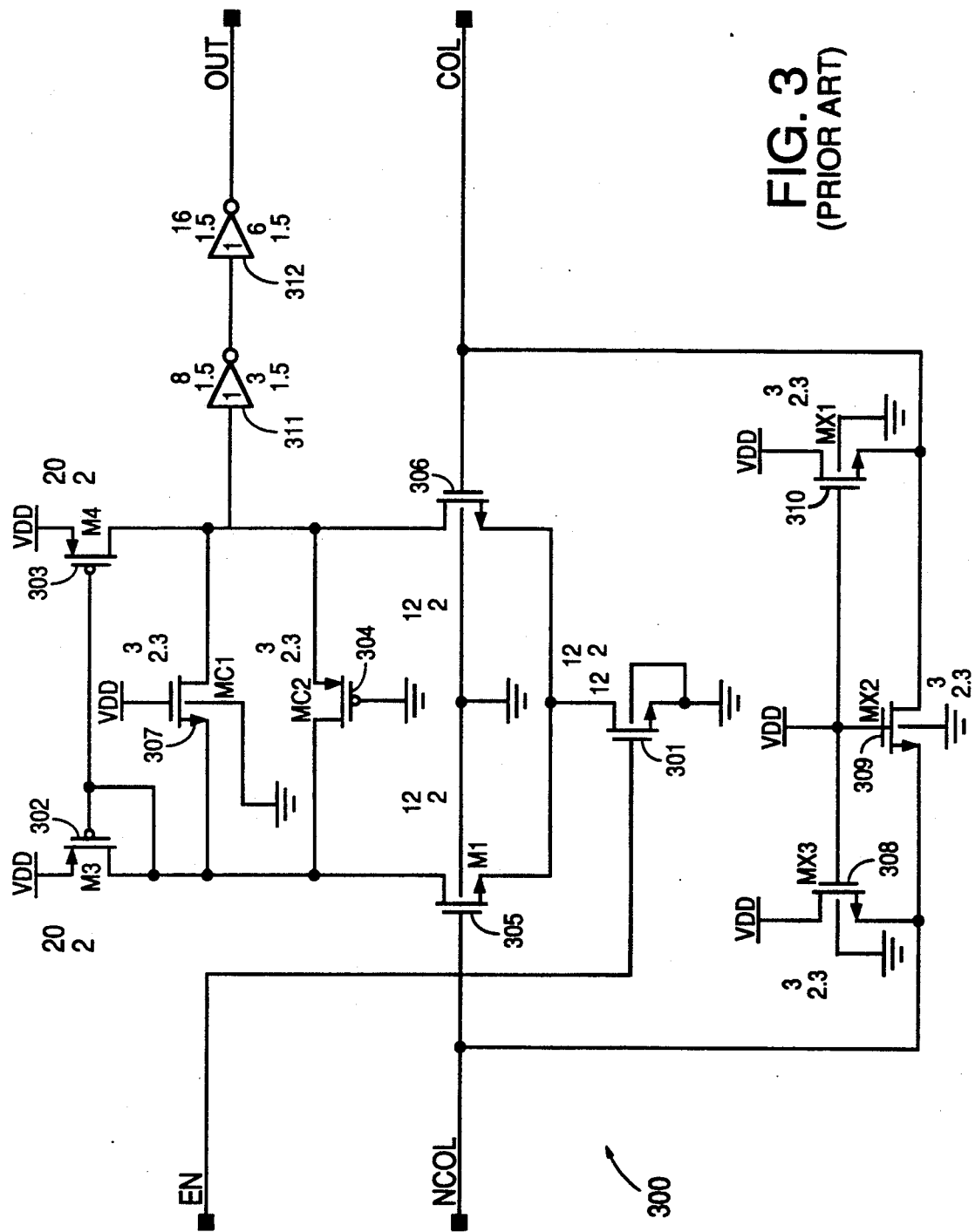
FIG. 3 is a schematic diagram of a 1-bit sense amplifier circuit 300 suitable for use in the sense amplifier structure 111 in RAM 105 of the RAMDAC circuit 100.

Of significance is the fact that sense amplifier structures 403a and 403b can be operated simultaneously and enabled independently, so that content of RAM 405 at the location specified in the video path by the pixel address on port 408 can be provided simultaneously to the both CVR 409 and DACs 406a, 406b and 406c. Therefore, unlike the structure described in conjunction with FIG. 2, the video path can be directly probed during testing from the 24-bit color value received into CVR 409 at the same time as it is provided to DAC structure 406. Further, because the additional set of sense amplifiers 403b are provided, there is no need to route a 24-bit bus for CVR 409 in the vicinity of DACs 406a, 406b and 406c. The space saved by not having to provide the 24-bit bus in the vicinity of the DACs 406a-406c is more than sufficient to provide the additional set of sense amplifiers 403b. This is because, unlike sense amplifiers 403a, which are required to achieve video rate output during normal operation, sense amplifiers 403b, which are used only for initialization and update of the RAM 405, or for digital testing of the video path, are not required to have the performance of sense amplifier structure 403a. As a result, a 1-bit sense amplifier circuit much smaller than the circuit 300 (FIG. 3) provided above can be used as the building block for sense amplifiers 403b, resulting in substantial savings in layout area. In addition, not having to tap the 24-bit bus from the vicinity of sense amplifiers 403a allows DACs 406a, 406b and 406c to be laid out even closer to the sense amplifiers 403a, further minimizing the delay between these two structures.

Figure 5:
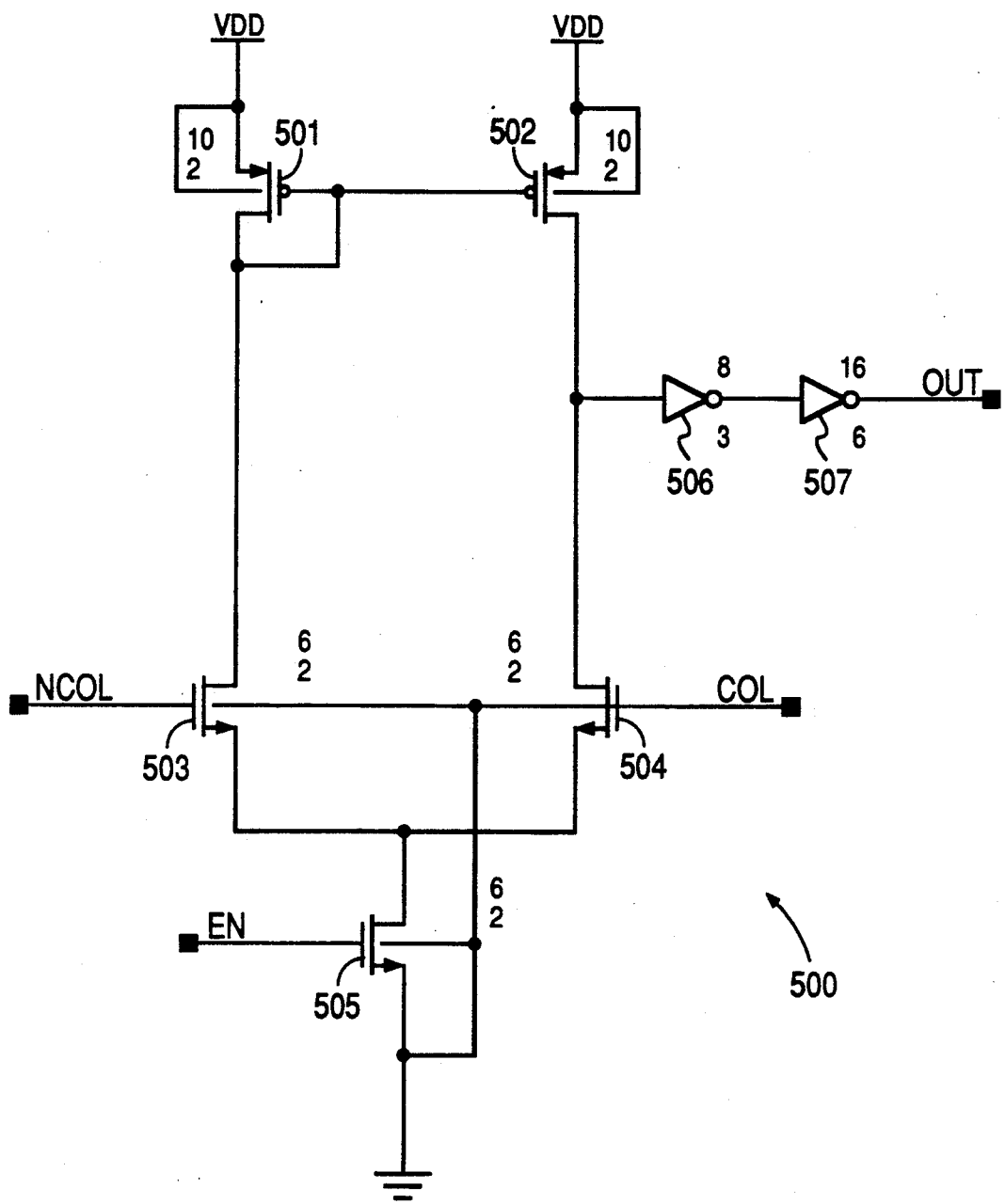
FIG. 5 is a schematic diagram of a 1-bit sense amplifier structure 500 for use with the second sense amplifier structure 403b in the RAMDAC circuit 400 of FIG. 4.

A 1-bit sense amplifier circuit 500 suitable for use in the sense amplifier structure 403b is shown in FIG. 5. As shown in FIG. 5, when the enable signal EN is at logic high, thereby turning on transistor 505, a current flow path is enabled through either transistors 501 and 503, or transistors 502 and 504. The value of the output datum at the output terminal OUT of sense amplifier circuit 500 depends on the values of complementary signals COL and NCOL. Signals COL and NCOL, unlike the corresponding signals in circuit 300 above, each have a 5-volt voltage swing, since circuit 500 is not required the performance of circuit 300. As shown in FIG. 5, circuit 500 requires only nine transistors. In FIG. 5, for example only, the sizes of PMOS transistors 501, 502, expressed in the channel width-to-length (W/L) ratio, can be 10/2, and the sizes of NMOS transistors 503, 504 and 505 can be 6/2. Inverters 506 and 507 have PMOS transistor W/L ratios of 16/2 and 32/2 respectively, and NMOS transistor W/L ratios of 6/2 and 12/2 respectively.

The above detailed description are provided to illustrate the specific embodiments above. Numerous variations and modifications are possible within the scope of the present invention. For example, in FIG. 4, the address register 402 and the pixel register 413 are shown to be placed adjacent each other. Other placements of these registers 402 and, 413, such as on opposite sides of RAM 405, are also possible. The present invention is defined by the following claims.

We claim:

1. A structure for a RAMDAC, comprising:
   a plurality of random access memory cells organized in memory words accessed by memory addresses;
   a first register for receiving a first address;
   a second register for receiving a second address;
   multiplexing means for selecting one of said first and second addresses;
   first and second sense amplifier means for sensing the memory word specified by said selected address and for providing an output word in accordance with the content of said memory word sensed; and
   means for digital-to-analog conversion to transform said output word of said first sense amplifier means into analog signals when said first sense amplifier means is enabled.

2. A structure as in claim 1, further comprising a data register for receiving said output word from said second sense amplifier means.

3. A structure as in claim 2, further comprising:
   a data port for providing contents of said data register to an external device and for receiving an address of said memory words to be stored in said second register and an input word for writing into the memory word corresponding to said address received.

4. A method for providing a RAMDAC, comprising the steps of:
   providing a plurality of random access memory cells organized in memory words accessed by memory addresses;
   providing a first register for receiving a first address;
   providing a second register for receiving a second address;
   providing a multiplexer for selecting one of said first and second addresses;
   providing first and second sense amplifier means for sensing the memory word selected address and for providing an output word in accordance with the memory word sensed; and
   providing digital-to-analog conversion to transform said output word of said first sense amplifier means into analog signals when said first sense amplifier means is enabled.

5. A method as in claim 4, further comprising the step of providing a data register for receiving said output word from said second sense amplifier means.

6. A method as in claim 5, further comprising the step of:
   providing contents of said data register to an external device and receiving from said external device an address of said memory words and an input word to be stored in said second register for writing in the memory word corresponding to said address received.

* * * * *